(12) United States Patent
Lee

(10) Patent No.: US 9,589,603 B2
(45) Date of Patent: Mar. 7, 2017

(54) SEMICONDUCTOR DEVICE AND OPERATING METHOD THEREOF

(71) Applicant: SK hynix Inc., Gyeonggi-do (KR)

(72) Inventor: Kang-Seol Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 287 days.

(21) Appl. No.: 14/460,911

(22) Filed: Aug. 15, 2014

(65) Prior Publication Data

US 2015/0241509 A1 Aug. 27, 2015

(30) Foreign Application Priority Data

Feb. 24, 2014 (KR) ........................ 10-2014-0021066

(51) Int. Cl.
G11C 17/18 (2006.01)
G11C 7/06 (2006.01)
G11C 17/16 (2006.01)
G11C 7/12 (2006.01)

(52) U.S. Cl.
CPC ................ *G11C 7/067* (2013.01); *G11C 7/12* (2013.01); *G11C 17/16* (2013.01); *G11C 17/18* (2013.01)

(58) Field of Classification Search
CPC ......... G11C 7/067; G11C 17/16; G11C 17/18; G11C 7/12
USPC ...................................... 365/225.7
See application file for complete search history.

(56) References Cited

U.S. PATENT DOCUMENTS

| 4,730,273 | A | * | 3/1988 | Sluss | G11C 17/18 365/201 |
| 5,453,696 | A | * | 9/1995 | Becker | G11C 29/02 324/550 |
| 5,694,047 | A | * | 12/1997 | Goetting | G11C 17/18 257/530 |
| 5,982,656 | A | * | 11/1999 | Cutter | G11C 29/02 324/550 |
| 5,986,320 | A | * | 11/1999 | Kawano | G11C 29/44 257/209 |
| 6,185,705 | B1 | * | 2/2001 | Cutter | G11C 17/18 324/537 |
| 6,236,219 | B1 | * | 5/2001 | Morgan | G01R 15/09 324/502 |
| 6,300,771 | B1 | * | 10/2001 | Goshima | G01R 31/2812 324/550 |
| 6,346,845 | B1 | * | 2/2002 | Choi | G11C 17/18 327/525 |

(Continued)

FOREIGN PATENT DOCUMENTS

KR 1020040059461 7/2004
KR 1020080097537 11/2008

*Primary Examiner* — Viet Q Nguyen
(74) *Attorney, Agent, or Firm* — IP & T Group LLP

(57) ABSTRACT

A semiconductor device may include: a fuse array including a plurality of fuses; a voltage generation unit suitable for generating a first measurement voltage having a preset level; and a measurement unit suitable for supplying the first measurement voltage to a sourcing node of the fuse array and a second measurement voltage, which is provided from an external through a first pad, to a sinking node of the fuse array, and outputting a current, which is caused by voltage difference between the first and second measurement voltages and passes through one or more of the multiple fuses, through the first pad.

17 Claims, 3 Drawing Sheets

(56) References Cited

U.S. PATENT DOCUMENTS

| | | | | |
|---|---|---|---|---|
| 6,373,762 B2* | 4/2002 | Morgan | ............ | G01R 15/09 |
| | | | | 365/201 |
| 6,541,983 B2* | 4/2003 | Khoury | ............ | G01R 31/07 |
| | | | | 324/525 |
| 6,762,608 B2* | 7/2004 | Damon | ............ | H01L 22/34 |
| | | | | 257/E23.147 |
| 6,983,404 B2* | 1/2006 | Cutter | ............ | G11C 17/18 |
| | | | | 714/721 |
| 7,145,346 B2* | 12/2006 | Chung | ............ | G11C 17/16 |
| | | | | 324/525 |
| 7,200,064 B1* | 4/2007 | Boerstler | ............ | G11C 17/18 |
| | | | | 365/189.16 |
| 7,333,383 B2* | 2/2008 | Vogelsang | ............ | G11C 17/18 |
| | | | | 365/225.7 |
| 7,679,373 B2* | 3/2010 | Taki | ............ | H01L 23/5256 |
| | | | | 324/550 |
| 7,733,096 B2* | 6/2010 | Lin | ............ | G11C 17/165 |
| | | | | 324/550 |
| 8,760,170 B2* | 6/2014 | McDiarmid | ............ | H02S 50/10 |
| | | | | 324/509 |
| 9,281,076 B2* | 3/2016 | Nishioka | ............ | G11C 17/18 |
| 2005/0249014 A1* | 11/2005 | Chung | ............ | G11C 17/18 |
| | | | | 365/225.7 |
| 2006/0061413 A1* | 3/2006 | Kim | ............ | G05F 3/262 |
| | | | | 327/543 |
| 2011/0273949 A1* | 11/2011 | Chen | ............ | G11C 17/18 |
| | | | | 365/225.7 |
| 2015/0206594 A1* | 7/2015 | Hoefler | ............ | G11C 29/027 |
| | | | | 365/96 |
| 2015/0310930 A1* | 10/2015 | Boldt | ............ | G11C 17/16 |
| | | | | 324/550 |

* cited by examiner

SEMICONDUCTOR DEVICE AND OPERATING METHOD THEREOF

CROSS-REFERENCE TO RELATED APPLICATIONS

The present application claims priority of Korean Patent Application No. 10-2014-0021066, filed on Feb. 24, 2014, which is incorporated herein by reference in its entirety.

BACKGROUND

1. Field

Various embodiments of the present invention relate to a semiconductor device, and more particularly, to a semiconductor device having a fuse array.

2. Description of the Related Art

In general, semiconductor devices use fuses to increase yield and efficiently perform test operations. An anti-fuse is a resistive fuse element having a high resistance, for example 100MΩ, in a non-program state, and a low resistance, for example 100KΩ, in a program state. When an anti-fuse is implemented with a transistor, the anti-fuse serves as a capacitor in the non-program state, and a resistor in the program state. Anti-fuses are typically formed using a very thin dielectric material interposed between two conductors. The anti-fuse is programmed by rupturing the dielectric material between both conductors using a high power supply voltage, for example 6V, for a given time. When the anti-fuse is programmed, the conductors of the anti-fuse are shorted to have a low resistance.

According to recent trends, the amount of data being stored in anti-fuses is increasing. Arrangement of a plurality of anti-fuses in an array has become common. However, anti-fuses may not all be programmed in the same manner because each of the anti-fuses has slightly different properties. This occurs despite the anti-fuses having the same fabrication conditions. Due to this fact, anti-fuses that are programmed under the same conditions may each require different voltage levels in order to rupture the dielectric material interposed between its two conductors.

It is therefore important to determine whether an appropriate voltage level is applied to rupture each of the anti-fuses or to check whether the anti-fuses have been correctly ruptured.

SUMMARY

Various embodiments are directed to a circuit capable of checking whether a fuse is ruptured to an intended level in a semiconductor device including a fuse array, in which a plurality of fuses is arranged.

In an embodiment, a semiconductor device may include: a fuse array including a plurality of fuses; a voltage generation unit suitable for generating a first measurement voltage having a preset level; and a measurement unit suitable for supplying the first measurement voltage to a sourcing node of the fuse array and a second measurement voltage, which is provided from an external (from an external source) through a first pad, to a sinking node of the fuse array, and outputting a current, which is caused by voltage difference between the first and second measurement voltages and passes through one or more of the multiple fuses, through the first pad.

Another embodiment includes an operating method of a semiconductor device with a fuse array having a plurality of fuses. The operating method may include: supplying a first measurement voltage having a preset level to a sourcing node of the fuse array, and a second measurement voltage, which is provided from an external through a first pad, to a sinking node of the fuse array; selecting one or more of the plurality of fuses in response to an address signal; and outputting a current, which is caused by a voltage difference between the first and second measurement voltages and passes through the selected fuses, through the first pad.

In an embodiment, a semiconductor device may include: multiple fuses; a selection unit suitable for selecting one or more of the multiple fuses; and a measurement unit suitable for making one or more electrical paths, each of which includes a ruptured fuse among the selected fuses between first and second measurement voltages, and sensing an amount of current flowing through each of the electrical paths, wherein the current is generated by a voltage difference between the first and second measurement voltages.

DETAILED DESCRIPTION

Figure 1:
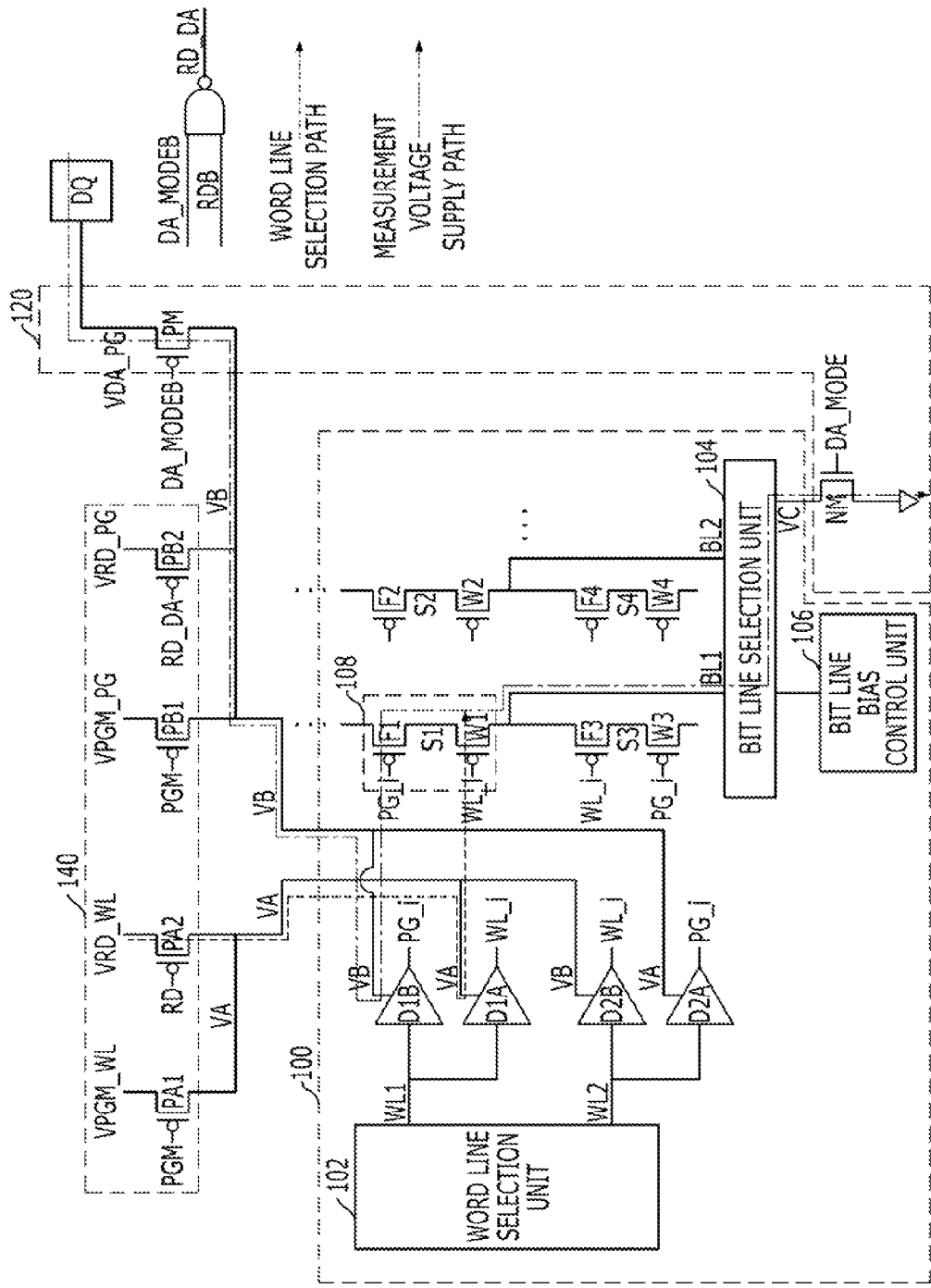
FIG. 1 is a block diagram illustrating a semiconductor device in accordance with a first embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

First Embodiment

FIG. 1 is a block diagram illustrating a semiconductor device in accordance with a first embodiment of the present invention.

Referring to FIG. 1, the semiconductor device may include a fuse array 100, a measurement unit 120, and a voltage supply unit 140. The fuse array 100 may include a word line selection unit 102, a bit line selection unit 104, and a bit line bias control unit 106.

The fuse array 100 may include a plurality of fuses F1 to F4. The fuse array 100 may select one of the multiple fuses F1 to F4 by selecting one of a plurality of word lines WL1 and WL2 and one of a plurality of bit lines BL1 and BL2 in response to an address signal (not illustrated).

The word line selection unit 102 of the fuse array 100 may select one of the multiple word lines WL1 and WL2 in response to the address signal, and the bit line selection unit 104 of the fuse array 100 may select one of the multiple bit lines BL1 and BL2 in response to the address signal. The bit line bias control unit 106 of the fuse array 100 may provide a precharge voltage and a reference voltage for the operation of the bit line selection unit 104.

The voltage supply unit 140 may supply program voltages VPGM_WL and VPGM_PG to the fuse array 100 to rupture each of the multiple fuses F1 to F4 in a program operation mode. Furthermore, the voltage supply unit 140 may supply read voltages VRD_WL and VRD_PG to the fuse array 100 to output the rupture status of each of the multiple fuses F1 to F4 in a read operation mode.

The measurement unit 120 may supply a first measurement voltage VDA_PG to the fuse array 100 to measure a resistance value of each of the multiple fuses F1 to F4 in a measurement operation mode. The first measurement voltage VDA_PG may be supplied from an external through the pad DQ, and is suitable to operate the measurement unit 220.

The semiconductor device may program the multiple fuses F1 to F4 during the program operation mode in response to a program operation signal PGM. While the program operation signal PGM is activated to a low level, the semiconductor device may program the multiple fuses F1 to F4 (the program operation mode), and while the program operation signal PGM is deactivated to a high level, the semiconductor device may exit from the program operation mode.

The semiconductor device may output the electrical connection status of the multiple fuses F1 to F4 during the read operation mode, or output the resistance value of the multiple fuses F1 to F4 during the measurement operation mode in response to a read operation signal RD and a measurement operation signal DA_MODE. While the read operation signal RD is activated to a low level and the measurement operation signal DA_MODE is deactivated to a low level, the semiconductor device may output the electrical connection status of the multiple fuses F1 to F4 (the read operation mode). While the read operation signal RD is activated to a low level and the measurement operation signal DA_MODE is activated to a high level, the semiconductor device may output resistance values of the multiple fuses F1 to F4 (the measurement operation mode). While the read operation signal RD is deactivated to a high level, the semiconductor device may exit from the read operation mode and the measurement operation mode regardless of activation of the measurement operation signal DA_MODE.

The voltage supply unit 140 may include a PMOS transistor PA1 and a PMOS transistor PB1. The PMOS transistor PA1 may supply a program select voltage VPGM_WL to a first sourcing node VA of the fuse array 100 in response to the program operation signal PGM, and the PMOS transistor PB1 may supply a program driving voltage VPGM_PG to a second sourcing node VB of the fuse array 100 in response to the program operation signal PGM. Furthermore, the voltage supply unit 140 may include a PMOS transistor PA2 and a PMOS transistor PB2. The PMOS transistor PA2 may supply a read select voltage VRD_WL to the first sourcing node VA in response to the read operation signal RD, and the PMOS transistor PB2 may supply a read driving voltage VRD_PG to the second sourcing node VB in response to a read-measurement operation signal RD_DA. For example, the read-measurement operation signal RD_DA may be a result of NAND operation on an inverted signal DA_MODEB of the measurement operation signal DA_MODE and an inverted signal RDB of the read operation signal RD, or a result of OR operation on the measurement operation signal DA_MODE and the read operation signal RD.

The measurement unit 120 may include a PMOS transistor PM and an NMOS transistor NM. The PMOS transistor PM may supply the first measurement voltage VDA_PG to the second sourcing node VB in response to the measurement operation signal DA_MODE, and the NMOS transistor NM may couple a sinking node VC of the fuse array 100 to a ground voltage VSS in response to the measurement operation signal DA_MODE.

Hereafter, the operation of a selected fuse in the fuse array 100 will be described.

First, the first word line WL1 of the plurality of word lines WL1 and WL2 may be selected by the word line selection unit 103. Thus, the voltages supplied through the first and second sourcing nodes VA and VB may be supplied to the first word line WL1.

Then, the first bit line BL1 of the plurality of bit lines BL1 and BL2 may be selected by the bit line selection unit 104. Thus, the voltages supplied through the first and second sourcing nodes VA and VB may be provided to a fuse area 108 corresponding to the first word line WL1 and the first bit line BL1. The fuse area in the disclosure may indicate each of the multiple fuses F1 to F4, and corresponding transistor of the plurality of select transistors W1 to W4. Each of the multiple fuses F1 to F4 and corresponding transistor of the multiple select transistors W1 to W4 may be serially coupled at a corresponding fuse node of the plurality of fuse nodes S1 to S4.

An operation of rupturing the selected fuse area 108 may be performed as follows.

When the program operation signal PGM is activated, and the read operation signal RD and the measurement operation signal DA_MODE are deactivated, the program driving voltage VPGM_PG may be supplied to the gate of the fuse F1 or the fuse transistor F1 in the selected fuse area 108, and the program select voltage VPGM_WL may be supplied to the gate of the select transistor W1 in the selected fuse array 108.

The select transistor W1 may be turned on in response to the program select voltage VPGM_WL, and couple the fuse transistor F1 to the bit line selection unit 104 through the fuse node S1. When the program driving voltage VPGM_PG has a sufficiently high voltage level such that a predetermined voltage difference between the gate of the fuse transistor F1 and the fuse node S1 may be formed, the fuse transistor F1 may be ruptured. On the other hand, when the program driving voltage VPGM_PG has a lower voltage level such that a lower voltage difference than the predetermined voltage difference between the gate of the fuse transistor F1 and the fuse node S1 may be formed, the fuse transistor F1 may not be ruptured. That is, the rupture of the fuse transistor F1 may be dependent on the voltage level of the program driving voltage VPGM_PG. The voltage level of the program driving voltage VPGM_PG may be set according to whether the fuse transistor F1 is to be ruptured.

An operation of reading the rupture status of the selected fuse area 108 may be performed as follows.

When the read operation signal RD is activated to a low level, the program operation signal PGM is deactivated to a high level, the measurement operation signal DA_MODE is deactivated to a low level, the read-measurement operation signal RD_DA may be activated to a low level, the read driving voltage VRD_PG may be supplied to the gate of the fuse transistor F1 in the selected fuse area 108, and the read select voltage VRD_WL may be supplied to the gate of the select transistor W1 in the selected fuse area 108.

The select transistor W1 may be turned on in response to the read select voltage VRD_WL, and couple the fuse transistor F1 to the bit line selection unit 104 through the fuse node S1. When the fuse transistor F1 is ruptured, the read driving voltage VRD_PG applied to the gate of the fuse transistor F1 may be transmitted to the fuse node S1. On the other hand, when the fuse transistor F1 is not ruptured, the read driving voltage VRD_PG applied to the gate of the fuse transistor F1 may not be transmitted to the fuse node S1. The bit line selection unit 104 may sense whether the read driving voltage VRD_PG is transmitted to the fuse node S1, and output the sensing result or the rupture status of the fuse transistor F1 to the outside.

An operation of measuring a resistance value of the selected fuse area 108 in the fuse array 100 may be performed as follows.

The description will be made under the assumption that the selected fuse transistor F1 is ruptured, and the gate of the fuse transistor F1 and the fuse node S1 in the selected fuse area 108 are electrically coupled to each other.

When the read operation signal RD is activated to a low level, the measurement operation signal DA_MODE is activated to a high level, the program operation signal PGM is deactivated to a high level, the read-measurement operation signal RD_DA may be deactivated to a high level, the first measurement voltage VDA_PG, which may be applied from the external (i.e. from an external device or source), for example, from the external through the pad DQ, may be supplied to the gate of the fuse transistor F1 in the selected fuse area 108, the read select voltage VRD_WL may be supplied to the gate of the select transistor W1 in the selected fuse area 108, and the bit line BL1 selected through the bit line selection unit 104 may be electrically coupled to the ground voltage VSS.

The select transistor W1 may be turned on in response to the read select voltage VRD_WL, and couple the fuse transistor F1 to the ground voltage VSS through the bit line selection unit 104 and the fuse node S1. When the gate of the fuse transistor F1 and the fuse node S1 are normally coupled to each other, that is, when the fuse transistor F1 is in normal rupture status so that there is ideally no resistance in the electrical path including the pad DQ, the fuse transistor F1, the ground voltage VSS, and the first measurement voltage VDA_PG applied to the gate of the fuse transistor F1 may be quickly transmitted to the fuse node S1. On the other hand, when the gate of the fuse transistor F1 and the fuse node S1 are not normally coupled to each other, that is, when the fuse transistor F1 is not in the normal rupture status, a considerable amount of resistance may remain in the electrical path including the pad DQ, the fuse transistor F1, and the ground voltage VSS, and the first measurement voltage VDA_PG applied to the gate of the fuse transistor F1 may be relatively slowly transmitted to the fuse node S1. As such, the transmission speed of the first measurement voltage VDA_PG, that is, the amount of current flowing through the electrical path including the pad DQ, the fuse transistor F1, and the ground voltage VSS may differ according to the rupture state of the fuse transistor F1 in the selected fuse area 108. Thus, whether the fuse transistor F1 of the selected fuse area 108 is normally ruptured may be determined by measuring the amount of current flowing through the pad DQ.

In the disclosure, the fuse transistor F1 of the plurality of fuses F1 to F4 of the fuse array 100 is described as an example. The above description may be sequentially or concurrently applied to one or more of the plurality of fuses F1 to F4.

The pad DQ of the first embodiment may be a dedicated pad or a multipurpose pad.

The semiconductor device in accordance with the first embodiment of the present invention may determine whether each of the multiple fuses F1 to F4 of the fuse array 100 is normally ruptured by supplying the first measurement voltage VDA_PG from the external to the fuse array 100 through the pad DQ, and measuring the amount of current flowing through the pad DQ.

Second Embodiment

Figure 2:
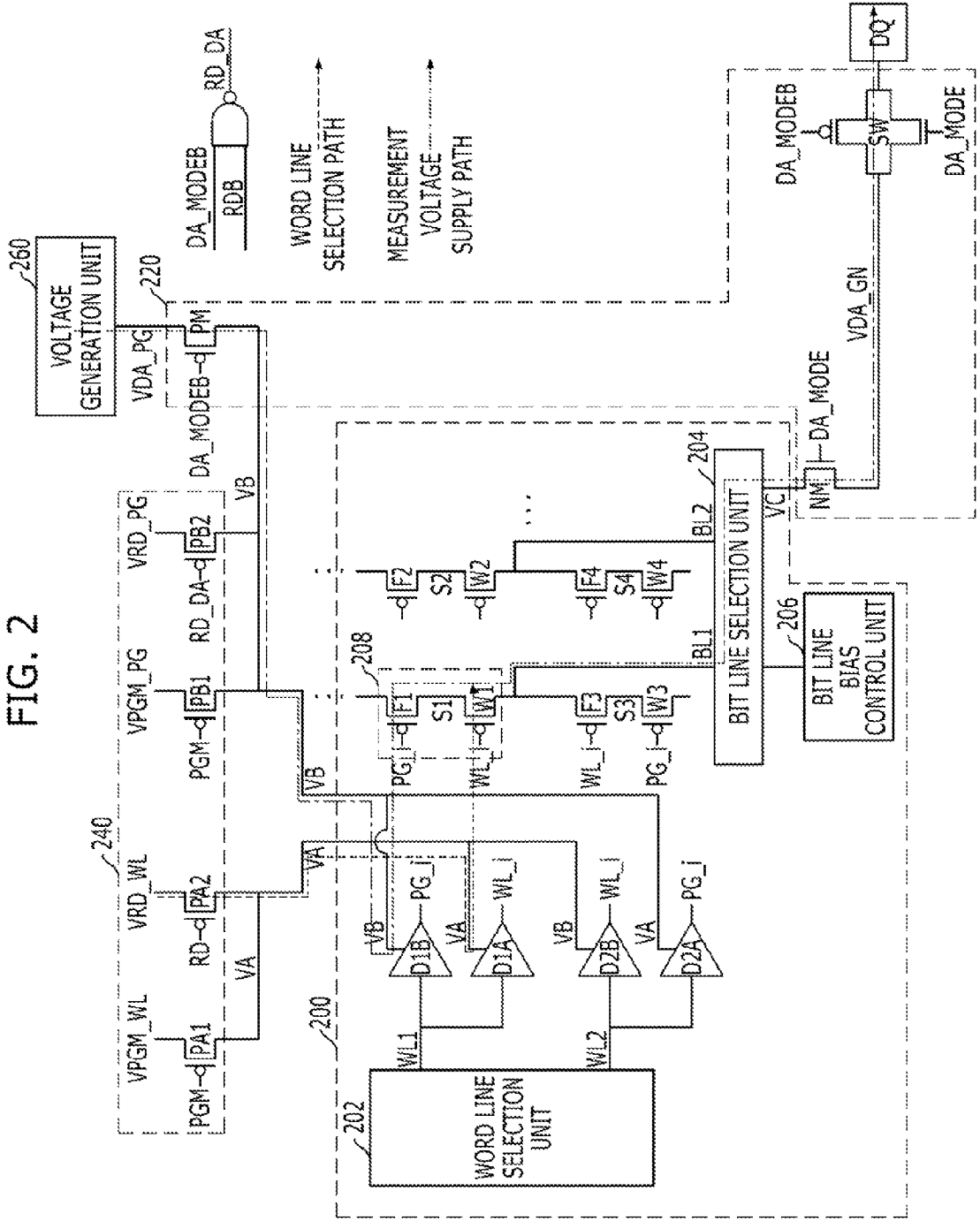
FIG. 2 is a block diagram illustrating a semiconductor device in accordance with a second embodiment of the present invention.

FIG. 2 is a block diagram illustrating a semiconductor device in accordance with a second embodiment of the present invention.

Referring to FIG. 2, the semiconductor device in accordance with the second embodiment of the present invention may include a fuse array 200, a voltage generation unit 260, a measurement unit 220, and a voltage supply unit 240. The fuse array 200 may include a word line selection unit 202, a bit line selection unit 204, and a bit line bias control unit 206. The semiconductor device in accordance with the second embodiment of the present invention may be similar to the semiconductor device described above with reference to FIG. 1 in that the semiconductor devices may determine whether each of the multiple fuses F1 to F4 is normally ruptured by supplying the first measurement voltage VDA_PG and measuring the amount of current flowing through the pad DQ.

In accordance with the first embodiment of the present invention, the first measurement voltage VDA_PG may have a sufficiently higher level than the ground voltage VSS, and may be supplied from the external to the fuse array 100 through the pad DQ. In accordance with the second embodiment of the present invention, the first measurement voltage VDA_PG may have a sufficiently higher level than a second measurement voltage VDA_GN. In the second embodiment, the first measurement voltage VDA_PG may be internally supplied from the voltage generation unit 260 to the fuse array 200. The second measurement voltage VDA_GN may correspond to the ground voltage VSS coupled to the sinking node VC of the first embodiment. In the second embodiment, the NMOS transistor NM may couple the sinking node VC of the fuse array 200 to a pad DQ in response to the measurement operation signal DA_MODE. Unlike the first embodiment, the semiconductor device according to the second embodiment may include a voltage generation unit 260 for generating the first measurement voltage VDA_PG, and a pad DQ electrically coupled to the sinking node VC of the fuse array 200.

The measurement unit 220 may supply the first measurement voltage VDA_PG to the sourcing node VB of the fuse array 200, couple the sinking node VC to a pad DQ, to which the second measurement voltage VDA_GN is supplied, and measure a resistance value of each of the multiple fuses F1 to F4 of the fuse array 200, in the measurement operation mode. The first measurement voltage VDA_PG may have a higher level than the second measurement voltage VDA_GN such that the measurement unit 220 normally operates.

The voltage generation unit 260 may be enabled in the measurement operation mode and generate the first measurement voltage VDA_PG having a preset level.

The measurement unit 220 may include a PMOS transistor PM and a transmission transistor SW as well as a NMOS transistor NM. The PMOS transistor PM may supply the first measurement voltage VDA_PG generated by the voltage generation unit 260 to the second sourcing node VB of the fuse array 200 in response to the measurement operation signal DA_MODE. The NMOS transistor NM may couple the sinking node VC of the fuse array 200 to the transmission transistor SW in response to the measurement operation signal DA_MODE, and the transmission transistor SW may couple the NMOS transistor NM to the pad DQ, to which the second measurement voltage VDA_GN is supplied, in response to the measurement operation signal DA_MODE and an inverted signal DA_MODEB thereof.

The operation of measuring a resistance value of the selected fuse area 208 in the fuse array 200 may be performed as follows.

The description will be made under assumption that the selected fuse transistor F1 is ruptured, and the gates of the fuse transistor F1 and the fuse node S1 in the selected fuse area 208 are coupled to each other.

When the read operation signal RD is activated to a low level, the measurement operation signal DA_MODE is activated to a high level, the program operation signal PGM may be deactivated to a high level, the read-measurement operation signal RD_DA may be deactivated to a high level, the first measurement voltage VDA_PG generated by the voltage generation unit 260 may be supplied to the gate of the fuse transistor F1 in the selected fuse area 208, the read select voltage VRD_WL may be supplied to the gate of the select transistor W1 in the selected fuse area 208, and the bit line BL1 selected through the bit line selection unit 204 may be electrically coupled to the external through the pad DQ to receive the second measurement voltage VDA_GN from the external through the pad DQ.

The select transistor W1 may be turned on in response to the read select voltage VRD_WL, and couple the fuse transistor F1 to the pad DQ through the bit line selection unit 204 and the fuse node S1. Thus, the second measurement voltage VDA_GN may be supplied to the fuse transistor F1. When the gate of the fuse transistor F1 and the fuse node S1 are normally coupled to each other, that is, when the fuse transistor F1 is in normal rupture status so that there is ideally no resistance in the electrical path including the voltage generation unit 260, the fuse transistor F1, and the pad DQ, the amount of a current passing through the path caused by a voltage level difference between the first measurement voltage VDA_PG applied to the gate of the fuse transistor F1 and the second measurement voltage VDA_GN supplied to the fuse node S1 may be relatively large. On the other hand, when the gate of the fuse transistor F1 and the fuse node S1 are not normally coupled to each other, that is, when the fuse transistor F1 is not in the normal rupture status, a considerable amount of resistance in the electrical path including the voltage generation unit 260, the fuse transistor F1, and the pad DQ may remain, and the amount of the current induced by the voltage level difference between the first measurement voltage VDA_PG and the second measurement voltage VDA_GN may be relatively small. As such, the amount of current flowing through the electrical path caused by the voltage level difference between the first and second measurement voltages VDA_PG and VDA_GN may differ according to the rupture state of the fuse transistor F1 in the selected fuse area 208.

For example, when the voltage level of the first measurement voltage VDA_PG is set as several times the power supply voltage VDD, and the voltage level of the second measurement voltage VDA_GN is set as the ground voltage VSS, current flow may occur from the gate of the fuse transistor F1 to the fuse node S1. Thus, whether the fuse transistor F1 of the selected fuse area 208 is normally ruptured may be determined by measuring the amount of current flowing through the pad DQ.

The pad DQ of the second embodiment may be a dedicated pad or a multipurpose pad.

In the semiconductor device in accordance with the second embodiment of the present invention, the first measurement voltage VDA_PG, which is internally generated and has a relatively high level, may be a source voltage to the fuse array 200. The second measurement voltage VDA_GN, which is transmitted through the pad DQ and has a relatively low level, may be a sink voltage to the fuse array 200, and the amount of current flowing through the pad DQ may be measured to determine whether each of the multiple fuses F1 to F4 of the fuse array 200 was normally ruptured.

Third Embodiment

Figure 3:
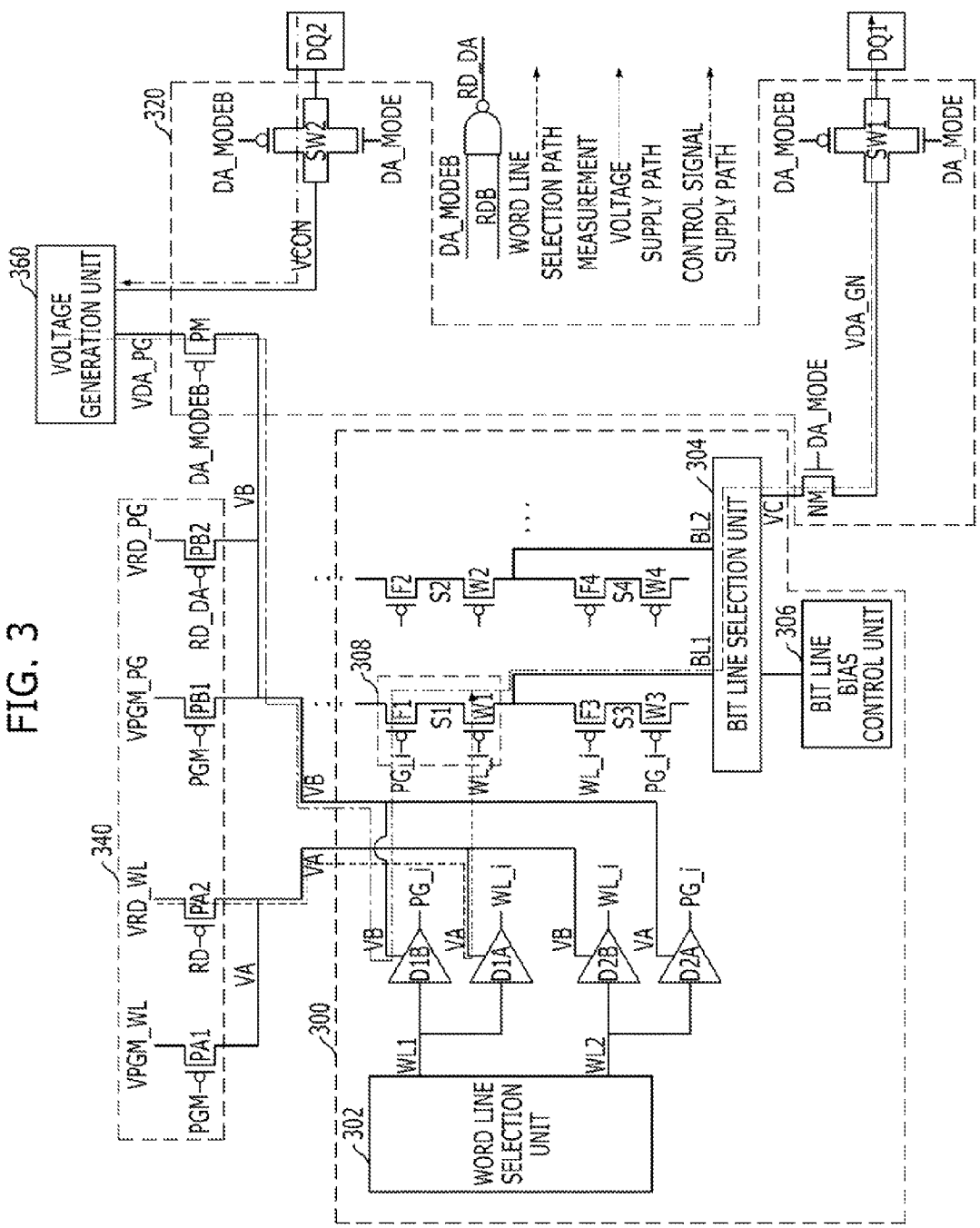
FIG. 3 is a block diagram illustrating a semiconductor device in accordance with a third embodiment of the present invention.

FIG. 3 is a block diagram illustrating a semiconductor device in accordance with a third embodiment of the present invention.

Referring to FIG. 3, the semiconductor device in accordance with the third embodiment of the present invention may include a fuse array 300, a voltage generation unit 360, a measurement unit 320, and a voltage supply unit 340. The fuse array 300 may include a word line selection unit 302, a bit line selection unit 304, and a bit line bias control unit 306.

The semiconductor device in accordance with the third embodiment of the present invention is the same as the semiconductor device in accordance with the second embodiment of the present invention described above with reference to FIG. 2 except that the measurement unit 320 further includes a transmission transistor SW2 for supplying a control signal VCON to the voltage generation unit 360 in response to the measurement operation DA_MODE and the inverted signal DA_MODEB thereof in order to control the voltage level of the first measurement voltage VDA_PG. The control signal VCON may be supplied from the external through a second pad DQ2. A first data pad DQ1 coupled to the transmission transistor SW1 may correspond to the data pad DQ coupled to the transmission transistor SW1 in the semiconductor device in accordance with the second embodiment of the present invention.

The voltage generation unit 360 may adjust the level of the first measurement voltage VDA_PG in response to the control signal VCON applied through the second pad DQ2 in the measurement operation mode. For example, the voltage generation unit 360 may generate the first measurement voltage VDA_PG two or three times higher than the level of the power supply voltage VDD. The resistance value for each of the multiple fuses F1 to F4 may be accurately measured through the process of adjusting the level of the first measurement voltage VDA_PG. That is, since the levels of the first and second measurement voltages VDA_PG and VDA_GN may be adjusted outside the semiconductor device, the level difference may be adjusted according to the measurement environment. Thus, the resistance value for each of the multiple fuses F1 to F4 may be measured in a state where the influence of the measurement environment is minimized.

The first and second pads DQ1 and DQ2 may be dedicated pads or multipurpose pads.

In the semiconductor device in accordance with the third embodiment of the present invention, the first measurement voltage VDA_PG, which is internally generated and has a relatively high level, may be a source voltage to the fuse array 300. The second measurement voltage VDA_GN, which is transmitted through the preset pad DQ and has a relatively low level, may be a sink voltage to the fuse array 300, and the amount of current flowing through the first pad DQ1 may be measured to determine whether each of the multiple fuses F1 to F4 of the fuse array 300 was normally ruptured.

Further, since the level of the first measurement voltage VDA_PG may be adjusted outside the semiconductor device, it is possible to determine whether each of the multiple fuses F1 to F4 of the fuse array 300 was normally ruptured with minimized influence of the measurement environment.

Although various embodiments have been described for illustrative purposes, it will be apparent to those skilled in the art that various changes and modifications may be made without departing from the spirit and scope of the invention as defined in the following claims.

For example, the positions and types of the logic gates and transistors in the above-described embodiments may be implemented in a different manner depending on the polarities of input signals.

What is claimed is:

1. A semiconductor device comprising:
a fuse array comprising multiple fuses;
a voltage generation unit suitable for generating a first measurement voltage having a preset level; and
a measurement unit suitable for supplying the first measurement voltage to a sourcing node of the fuse array and a second measurement voltage, which is provided from an external through a first pad, to a sinking node of the fuse array, and outputting a current, which is generated by a voltage difference between the first and second measurement voltages and passes through one or more of the multiple fuses, through the first pad,
wherein the fuse array sequentially selects one or more of the multiple fuses in response to an address signal.

2. The semiconductor device of claim 1, wherein the first measurement voltage is two or more times higher than a power supply voltage of the semiconductor device.

3. The semiconductor device of claim 2, wherein the voltage generation unit controls a level of the first measurement voltage in response to a control signal inputted through a second pad.

4. The semiconductor device of claim 2, wherein the second measurement voltage is a ground voltage.

5. The semiconductor device of claim 1, further comprising a voltage supply unit suitable for supplying a program voltage and supplying a read voltage to the fuse array.

6. An operating method of a semiconductor device with a fuse array having a plurality of fuses, comprising:
supplying a first measurement voltage having a preset level to a sourcing node of the fuse array, and a second measurement voltage, which is provided from an external through a first pad, to a sinking node of the fuse array;
selecting one or more of the plurality of fuses in response to an address signal; and
outputting a current, which is generated by a voltage difference between the first and second measurement voltages and passes through the selected one or more of the plurality of fuses, through the first pad,
wherein the selecting of one or more of the plurality of fuses sequentially or concurrently selects one or more of the plurality of fuses.

7. The operating method of claim 6, wherein the first measurement voltage is two or more times higher than a power supply voltage of the semiconductor device.

8. The operating method of claim 7, further comprising controlling a level of the first measurement voltage in response to a control signal inputted through a second pad.

9. The operating method of claim 7, wherein the second measurement voltage is a ground voltage.

10. The operating method of claim 6, further comprising:
supplying a program voltage to the fuse array; and
supplying a read voltage to the fuse array.

11. A semiconductor device comprising:
multiple fuses;
a selection unit suitable for selecting one or more of the multiple fuses; and
a measurement unit suitable for making one or more electrical paths, each of which includes a ruptured fuse among the selected fuses between a first measurement voltage and a second measurement voltage, and sensing an amount of current flowing through each of the electrical paths,
wherein the current is generated by voltage difference between the first measurement voltage and the second measurement voltage,
wherein the fuse array sequentially selects one or more of the multiple fuses in response to an address signal.

12. The semiconductor device of claim 11, further comprising a first pad,
wherein the first measurement voltage is provided from an external through the first pad.

13. The semiconductor device of claim 11, further comprising a second pad,
wherein the second measurement voltage is provided from an external through the second pad.

14. The semiconductor device of claim 11, further comprising a voltage generation unit suitable for controlling a level of the first measurement voltage.

15. The semiconductor device of claim 14, further comprising a third pad,
wherein the voltage generation unit controls the level of the first measurement voltage in response to a control signal externally provided through the third pad.

16. The semiconductor device of claim 11, wherein the voltage difference ranges from two times of a power supply voltage of the semiconductor device to three times of the power supply voltage.

17. The semiconductor device of claim 16, wherein the second measurement voltage is a ground voltage.

* * * * *